(12) United States Patent
Rahim et al.

(10) Patent No.: US 10,636,768 B2
(45) Date of Patent: Apr. 28, 2020

(54) INTEGRATED CIRCUIT MODULE AND METHOD OF FORMING SAME

(71) Applicant: Starkey Laboratories, Inc., Eden Prairie, MN (US)

(72) Inventors: Sayed Kaysarbin Rahim, Chaska, MN (US); Douglas F. Link, Plymouth, MN (US); Susan Marie Johansson, Eden Prairie, MN (US)

(73) Assignee: Starkey Laboratories, Inc., Eden Prairie, MN (US)

( * ) Notice: Subject to any disclaimer, the term of this patent is extended or adjusted under 35 U.S.C. 154(b) by 46 days.

(21) Appl. No.: 15/340,458

(22) Filed: Nov. 1, 2016

(65) Prior Publication Data

US 2018/0122778 A1    May 3, 2018

(51) Int. Cl.
*H01L 25/065* (2006.01)
*H01L 23/498* (2006.01)
(Continued)

(52) U.S. Cl.
CPC ...... *H01L 25/0657* (2013.01); *H01L 21/6835* (2013.01); *H01L 23/4985* (2013.01); *H01L 23/5387* (2013.01); *H01L 23/5389* (2013.01); *H01L 24/32* (2013.01); *H01L 24/73* (2013.01); *H01L 24/92* (2013.01); *H01L 24/94* (2013.01); *H01L 25/18* (2013.01); *H01L 25/50* (2013.01); *H01L 23/50* (2013.01); *H01L 24/29* (2013.01); *H01L 24/48* (2013.01); *H01L 24/83* (2013.01); *H01L 29/0657* (2013.01); *H01L 2221/68345* (2013.01); *H01L 2224/2919* (2013.01); *H01L 2224/32105* (2013.01); *H01L 2224/32106* (2013.01); *H01L 2224/32111* (2013.01); *H01L 2224/32147* (2013.01); *H01L 2224/4811* (2013.01); *H01L 2224/48145* (2013.01); *H01L 2224/73253* (2013.01); *H01L 2224/73265* (2013.01); *H01L 2224/83005* (2013.01); *H01L 2224/83868* (2013.01); *H01L 2224/83871* (2013.01); *H01L 2224/83874* (2013.01); *H01L 2224/92* (2013.01); *H01L 2224/92242* (2013.01); *H01L 2224/92247* (2013.01);
(Continued)

(58) Field of Classification Search
CPC ..... H01L 25/0657; H01L 25/18; H01L 25/50; H01L 23/4985; H01L 24/05
See application file for complete search history.

(56) References Cited

U.S. PATENT DOCUMENTS 5,825,631 A  10/1998 Prchal
7,408,253 B2  8/2008 Lin
(Continued)

*Primary Examiner* — Andrew Q Tran
(74) *Attorney, Agent, or Firm* — Mueting, Raasch & Gebhardt, P.A.

(57) ABSTRACT

Various embodiments of an integrated circuit module and a method of forming such module are disclosed. The module includes a first die having an active substrate, an integrated circuit disposed on a first major surface of the active substrate, and a cavity disposed in a second major surface of the active substrate. The module also includes a second die having a first major surface, a second major surface, and a conductive pad disposed on the second major surface. The second die is disposed at least partially within the cavity of the first die such that the first major surface of the second die faces the cavity of the first die.

15 Claims, 6 Drawing Sheets

(51) Int. Cl.
*H01L 25/00* (2006.01)
*H01L 25/18* (2006.01)
*H01L 23/00* (2006.01)
*H01L 21/683* (2006.01)
*H01L 23/538* (2006.01)
*H01L 29/06* (2006.01)
*H01L 23/50* (2006.01)
*H04R 25/00* (2006.01)

(52) U.S. Cl.
CPC .. *H01L 2224/94* (2013.01); *H01L 2225/0652* (2013.01); *H01L 2225/06517* (2013.01); *H01L 2225/06548* (2013.01); *H01L 2225/06555* (2013.01); *H01L 2225/06558* (2013.01); *H01L 2225/06568* (2013.01); *H01L 2924/00014* (2013.01); *H01L 2924/10158* (2013.01); *H01L 2924/15156* (2013.01); *H04R 25/60* (2013.01)

(56) References Cited

U.S. PATENT DOCUMENTS

| | | |
|---|---|---|
| 7,842,542 B2 | 11/2010 | Shim et al. |
| 7,902,676 B2 | 3/2011 | Chia |
| 8,659,113 B2 | 2/2014 | Shim et al. |
| 8,680,683 B1 | 3/2014 | Juskey et al. |
| 8,861,205 B2 | 10/2014 | Lee |
| 8,916,481 B2 | 12/2014 | Gan et al. |
| 9,704,809 B2 * | 7/2017 | Tran .................... H01L 23/13 |
| 2006/0108697 A1 * | 5/2006 | Wang .................. H01L 25/0652 257/777 |
| 2007/0069371 A1 * | 3/2007 | Iksan ................. H01L 23/3128 257/706 |
| 2011/0157858 A1 | 6/2011 | Jung et al. |
| 2013/0001770 A1 | 1/2013 | Liu |
| 2014/0252655 A1 | 9/2014 | Tran et al. |
| 2015/0071470 A1 | 3/2015 | Link et al. |
| 2015/0264475 A1 | 9/2015 | Link et al. |

* cited by examiner

INTEGRATED CIRCUIT MODULE AND METHOD OF FORMING SAME

BACKGROUND

Electronic devices such as hearing assistance devices continue to become more sophisticated while being further miniaturized. Such miniaturization, however, requires that integrated circuits and other components utilized in these devices take up less volume. For example, modern hearing assistance devices such as a hearing aids typically include a housing or shell and internal hearing assistance components such as a signal processor, a microphone, and a receiver that are disposed within the housing. Such hearing assistance devices are electronic instruments worn in or around the ear that compensate for hearing losses of hearing-impaired people by specially amplifying sound. The housing or shell of a hearing assistance device has a size limitation based on the application. For example, devices that include an in-the-ear portion have housings that are constrained by the geometry of the inner ear of the wearer. Such constraints require that the hearing assistance components disposed within the housing be reduced in volume while continuing to be required to perform increasingly complex tasks.

SUMMARY

In general, the present disclosure provides various embodiments of an integrated circuit module and a method of forming such module. The integrated circuit module can be used in any suitable application. For example, one or more integrated circuit modules described herein can be disposed in a housing of a hearing assistance device. The module can include a first die and a second die disposed at least partially within a cavity disposed in a surface of the first die.

In one aspect, the present disclosure provides an integrated circuit module that includes a first die having an active substrate, an integrated circuit disposed on a first major surface of the active substrate, and a cavity disposed in a second major surface of the active substrate. The module also includes a second die having a first major surface, a second major surface, and a conductive pad disposed on the second major surface. The second die is disposed at least partially within the cavity of the first die such that the first major surface of the second die faces the cavity of the first die.

In another aspect, the present disclosure provides a hearing assistance device that includes a flexible circuit substrate and an integrated circuit module disposed within the flexible circuit substrate. The integrated circuit module includes a first die having an active substrate, an integrated circuit disposed on a first major surface of the active substrate, and a cavity disposed in a second major surface of the active substrate. The module also includes a second die having a first major surface, a second major surface, and a conductive pad disposed on the second major surface. The second die is disposed at least partially within the cavity of the first die such that the first major surface of the second die faces the cavity of the first die.

In another aspect, the present disclosure provides a method of forming an integrated circuit module. The method includes disposing an integrated circuit on a first major surface of an active substrate wafer; singulating the active substrate wafer to form a first die; and disposing a cavity in a second major surface of the active substrate of the first die. The method further includes forming a second die, where the second die includes a first major surface, a second major surface, and a conductive pad disposed on the second major surface; and disposing the second die at least partially within the cavity such that the first major surface of the second die faces the cavity.

In another aspect, the present disclosure provides a method that includes disposing a first die on a first flexible circuit substrate portion, where the first die includes an active substrate having a first major surface and a second major surface, where an integrated circuit and a conductive pad are disposed on the first major surface of the active substrate; and electrically connecting the conductive pad of the first die to a conductive via of the first flexible circuit substrate portion. The method further includes disposing a cavity in the second major surface of the active substrate of the first die; disposing a second die on a second flexible circuit substrate portion such that a conductive pad of the second die is electrically connected to a conductive via of the second flexible circuit substrate portion; and connecting the first flexible circuit substrate portion to the second flexible circuit substrate portion such that the second die is disposed at least partially within the cavity of the first die.

All headings provided herein are for the convenience of the reader and should not be used to limit the meaning of any text that follows the heading, unless so specified.

The terms "comprises" and variations thereof do not have a limiting meaning where these terms appear in the description and claims. Such terms will be understood to imply the inclusion of a stated step or element or group of steps or elements but not the exclusion of any other step or element or group of steps or elements.

In this application, terms such as "a," "an," and "the" are not intended to refer to only a singular entity, but include the general class of which a specific example may be used for illustration. The terms "a," "an," and "the" are used interchangeably with the term "at least one." The phrases "at least one of" and "comprises at least one of" followed by a list refers to any one of the items in the list and any combination of two or more items in the list.

The phrases "at least one of" and "comprises at least one of" followed by a list refers to any one of the items in the list and any combination of two or more items in the list.

As used herein, the term "or" is generally employed in its usual sense including "and/or" unless the content clearly dictates otherwise.

The term "and/or" means one or all of the listed elements or a combination of any two or more of the listed elements.

As used herein in connection with a measured quantity, the term "about" refers to that variation in the measured quantity as would be expected by the skilled artisan making the measurement and exercising a level of care commensurate with the objective of the measurement and the precision of the measuring equipment used. Herein, "up to" a number (e.g., up to 50) includes the number (e.g., 50).

Also herein, the recitations of numerical ranges by endpoints include all numbers subsumed within that range as well as the endpoints (e.g., 1 to 5 includes 1, 1.5, 2, 2.75, 3, 3.80, 4, 5, etc.).

These and other aspects of the present disclosure will be apparent from the detailed description below. In no event, however, should the above summaries be construed as limitations on the claimed subject matter, which subject matter is defined solely by the attached claims, as may be amended during prosecution.

BRIEF DESCRIPTION OF THE DRAWINGS

Throughout the specification, reference is made to the appended drawings, where like reference numerals designate like elements, and wherein.

DETAILED DESCRIPTION

Figure 1:
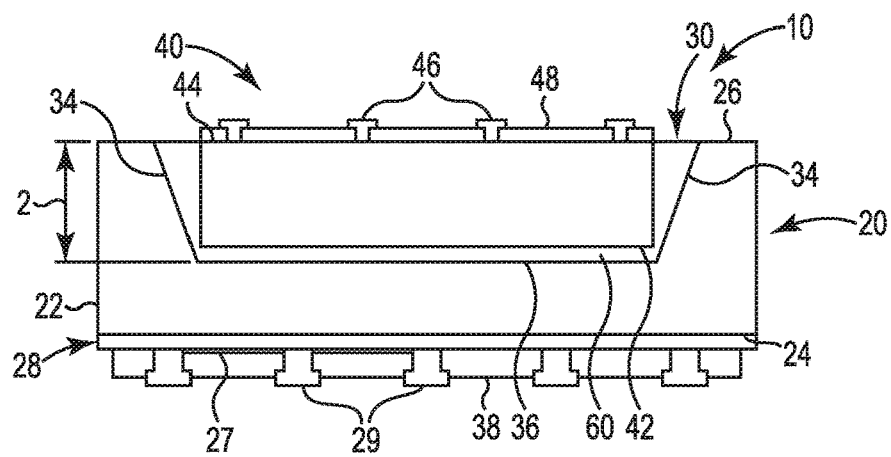
FIG. 1 is a schematic cross-section view of one embodiment of an integrated circuit module.

In general, the present disclosure provides various embodiments of an integrated circuit module and a method of forming such module. The integrated circuit module can be used in any suitable application. For example, one or more integrated circuit modules described herein can be disposed in a housing of a hearing assistance device. The module can include a first die and a second die disposed at least partially within a cavity disposed in a surface of the first die.

Typically, die packaging technologies provide two or more dies that are packaged in back-to-back configurations. In other words, a nonconductive surface of a first die is disposed on a nonconductive surface of a second die. Such configurations may, however, be too thick for the space provided, e.g., in a typical hearing assistance device. Further, back-to-back packaging can be complex and expensive. Such back-to-back configurations often require a thicker base layer for chip-in-flex processing, which can undesirably increase a z-axis height of the completed package.

One or more embodiments of integrated circuit modules described herein can provide various advantages. For example, one or more embodiments of modules can provide better miniaturization of electronics that are disposed, e.g., within hearing assistance devices. By disposing the second die at least partially within the cavity formed in the first die, the die module can be formed while minimizing the z-axis height of the module. Such modules can also provide a low cost means for integrating one or more integrated circuits into a single module.

The various embodiments of integrated circuit modules described herein can be used in any suitable electronic device, e.g., hearing instruments, smartphones, computers, tablets, fitness trackers, ear buds, wearable bio patches, etc. Further, various embodiments of integrated circuit modules described herein can be utilized with any hearing assistance device, including hearing aids, including but not limited to, behind-the-ear (BTE), in-the-ear (ITE), in-the-canal (ITC), receiver-in-canal (RIC), invisible-in-canal (IIC) or completely-in-the-canal (CIC) type hearing aids. It is understood that behind-the-ear type hearing aids may include devices that reside substantially behind the ear or over the ear. Such devices may include hearing aids with receivers associated with the electronics portion of the behind-the-ear device, or hearing aids of the type having receivers in the ear canal of the user, including but not limited to receiver-in-canal (RIC) or receiver-in-the-ear (RITE) designs. The present disclosure can also be used in hearing assistance devices generally, such as cochlear implant type hearing devices and deep insertion devices having a transducer, such as a receiver or microphone, whether custom fitted, standard, open fitted or occlusive fitted. It is understood that other hearing assistance devices not expressly stated herein may be used in conjunction with the disclosure. Hearing aids can be a conventional hearing aid or other types of hearing assistances devices, including personal sound amplification products (PSAPs) or ear-worn consumer electronic audio devices.

The present disclosure provides various embodiments of hearing assistance devices using the example of hearing aids. Hearing aids are only one type of hearing assistance device. Other hearing assistance devices include, but are not limited to, those in the disclosure. It is understood that their use in the disclosure is intended to demonstrate the present subject matter but not in a limited or exclusive or exhaustive sense.

Hearing aids typically include a housing or shell with internal components such as a signal processor, a microphone, and a receiver disposed in the housing. The housing or shell of a hearing assistance device has a size limitation based on the application. Specifically, devices that include an in-the-ear portion have housings that are constrained by the geometry of the inner ear of the wearer. Smaller device components and circuit packages may, therefore, be required.

Figure 2:
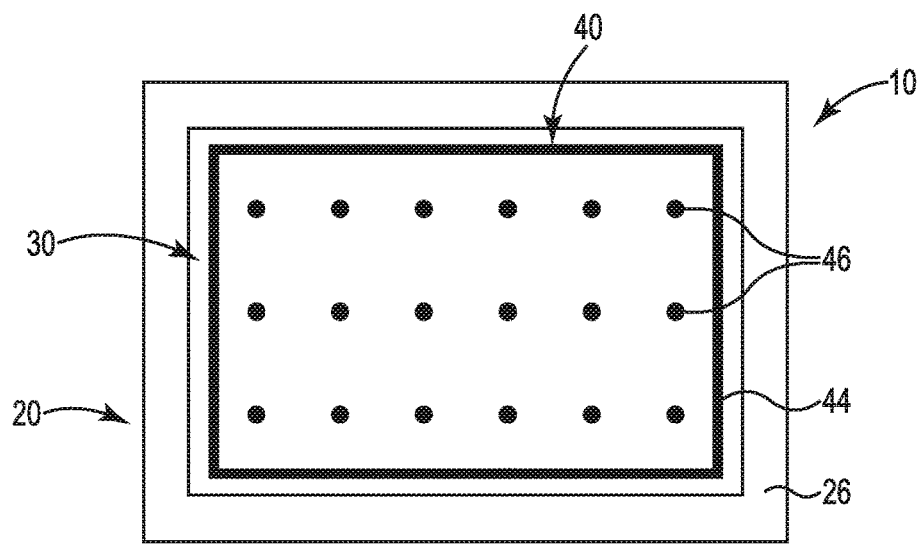
FIG. 2 is a top plan view of the integrated circuit module of FIG. 1.

FIGS. 1-2 are various views of one embodiment of an integrated circuit module 10. The module 10 includes a first die 20 and a second die 40. The first die 20 includes an active substrate 22 having a first major surface 24 and a second major surface 26. One or more integrated circuits 28 can be disposed on the first major surface 24 of the active substrate 22. The first die 20 also includes one or more cavities 30 disposed in the second major surface 26 of the active substrate 22. In one or more embodiments, the first major surface 24 can be considered a functional surface as it includes the one or more integrated circuits disposed thereon. Further, in one or more embodiments, the second major surface 26 can be considered a non-functional surface as it does not include one or more integrated circuits disposed thereon.

The second die 40 includes a first major surface 42 and a second major surface 44. One or more conductive pads 46 are disposed on the second major surface 44 of the second die 40. In one or more embodiments, the second die 40 is disposed at least partially within the cavity 30 of the first die 20 such that the first major surface 42 of the second die faces the cavity of the first die. As used herein, the term "faces the cavity of the first die" means that a normal to the first major surface 42 of the second die 40 intersects at least a portion of the cavity 30 of the first die 20. In one or more embodiments, the first major surface 42 can be considered a non-functional surface as it does not include one or more integrated circuits disposed thereon. Further, in one or more embodiments, the second major surface 44 can be considered a functional surface as it can include one or more integrated circuits disposed thereon.

Integrated circuit module 10 can be utilized in any suitable application and can include any suitable circuits, integrated circuit dies, or packages. In one or more embodiments, the integrated circuit module 10 can be a system-in-package (SIP) module that includes a digital signal processor (DSP) system and a transmitter, e.g., a 2.4 GHz radio, for use in hearing assistance devices. In one or more embodiments, the integrated circuit module 10 can be a power management integrated circuit (PMIC) module that is adapted to provide wireless or contact charging capabilities to a device or system.

The first die 20 of the module 10 can include any suitable die or package that has an active substrate 22. In one or more embodiments, the first die 20 includes at least one of a DSP die, a memory die, an EEPROM die, etc.

Further, the active substrate 22 of the first die 20 can include any suitable material or combination of materials, e.g., silicon. The active substrate 22 can take any suitable shape or combination of shapes and have any suitable dimensions.

Disposed on the first major surface 24 of the active substrate 22 is the integrated circuit 28. The integrated circuit 28 can include any suitable circuits or devices. In one or more embodiments, the integrated circuit 28 can include at least one of a processor, digital-to-analog converter, analog-to-digital converter, multiplexer, antenna, receiver, transmitter. Any suitable number of integrated circuits 28 can be disposed on or in the first major surface 24 of the active substrate 22. Further, one or more of the circuits and devices of the integrated circuit 28 can be electrically-connected together utilizing one or more conductors disposed on or in the first major surface 24 of the active substrate 22. In one or more embodiments, one or more circuits or devices of the integrated circuit 28 and conductors disposed on the first major surface 24 of the active substrate 22 can be disposed within the active substrate using any suitable technique or techniques. In one or more embodiments, two or more integrated circuits 28 can be disposed on the first major surface 24 of the active substrate, and the two or more integrated circuits can be separated using any suitable technique or combination of techniques by singulating the active substrate 22 as is further described herein.

In one or more embodiments, nonconductive material 38 can be disposed on at least a portion of one or both of the integrated circuit 28 and the first major surface 24 of the active substrate 22 of the first die 20. As used herein, the term "nonconductive material" refers to a material or combination of materials that is electrically insulating. Any suitable nonconductive material or materials can be utilized, e.g., polymers, epoxies, polyimides, adhesives, etc. Further, in one or more embodiments, a redistribution layer (not shown) can be disposed on at least a portion of one or both of the integrated circuit 28 and the first major surface 24. Any suitable redistribution layer can be utilized.

The first die 20 can also include one or more conductors 27 and one or more conductive pads 29 disposed on one or both of the first major surface 24 of the active substrate 22 and the integrated circuit 28. The conductors 27 and the pads 29 can include any suitable conductive material such that the conductors and pads can electrically connect the integrated circuit 28 to one or more additional circuits or components.

Disposed in the second major surface 26 of the active substrate 22 is the cavity 30. although depicted as including a single cavity 30, the active substrate 22 can include any suitable number of cavities. The cavity 30 can take any suitable shape or combination of shapes and have any suitable dimensions. For example, FIG. 2 is a schematic plan view of the second major surface 26 of the active substrate 22. As shown in FIG. 2, the cavity 30 has a rectangular shape in a plane parallel to the second major surface 26 of the active substrate. The cavity 30 can take a shape in the plane parallel to the second major surface 26 of the active substrate 22 that is the same as or different from a shape of the second die 40. The cavity 30 may have any suitable area in the plane parallel to the second major surface 26 of the active substrate 22.

Further, the cavity 30 may have any suitable depth 2 in a direction orthogonal to the first major surface 26 of the active substrate 22 (i.e., the z-axis). For example, in one or more embodiments, the cavity 30 may have a depth 2 in a direction orthogonal to the second major surface 26 of the active substrate 22 that is at least 25 microns and no greater than 760 microns.

In the embodiment illustrated in FIG. 1, the cavity 30 includes sidewalls 34 and a bottom wall 36. The sidewalls 34 can take any suitable shape. For example, as shown in FIG. 1, the sidewalls 34 have an angled shape.

The cavity 30 can be disposed in the second major surface 26 of the active substrate 22 using any suitable technique or combination of techniques. In one or more embodiments, the cavity 30 can be formed using a wet etching technique using any suitable etchant, e.g., KOH, and a patterned dielectric or masking layer. Further, in one or more embodiments, the cavity 30 can be formed by a standard dry reactive-ion etching or a plasma process that etches the active substrate 22 of the first die 20 through a patterned dielectric layer. Any suitable plasma gas can be utilized to etch the cavity 30 into the active substrate 22. In one or more embodiments, a plasma gas of $CF_4$ or $SF_6$ can be utilized on an active substrate 22 of silicon to form the cavity 30.

Disposed at least partially within the cavity 30 is the second die 40. The second die 40 can include any suitable circuits or components, e.g., integrated circuits, processors, memory dies (e.g., EEPROM dies), radio dies (e.g., 2.4 GHz radio dies), integrated passive device (IPD) dies, or other types of integrated circuits, etc. In one or more embodiments, the second die 40 can be formed separately from the first die 20 and then disposed at least partially within the cavity 30. For example, the second die 40 can be a packaged die that is formed separately and then disposed at least partially within the cavity 30 of the first die 20. In one or more embodiments, the first die 20 can be fabricated via a first type of fabrication process, and the second die 40 can be fabricated via a second type of fabrication process different from the first type of fabrication process. In one or more embodiments, the second die 40 can be formed within the cavity 30 in situ using any suitable technique or combination of techniques. While illustrated as only including a single second die 40 disposed within the cavity 30, in one or more embodiments, two or more dies can be disposed within the cavity as is further described herein.

The second die 40 includes the first major surface 42, the second major surface 44, and one or more conductive pads 46 disposed on the second major surface. The second die 40 is disposed at least partially within the cavity 30 of the first die 20 such that the first major surface 42 of the second die faces the cavity of the first die as is shown in FIG. 1. In one or more embodiments, the second die 40 can be disposed completely within the cavity 30.

Any suitable number of conductive pads 46 can be disposed on the second major surface 44 of the second die 40. The conductive pads 46 can provide electrical connections between one or more devices disposed within the second die 40 and other components, power sources, etc., disposed within or outside of the cavity 30 of the first die 20. In the embodiment illustrated in FIG. 1, the first die 20 is not electrically connected to the second die 40. In one or more embodiments, the first die 20 can be electrically connected to the second die 40 using any suitable technique or combination of techniques. For example, one or more vias can be formed through the active substrate 22 to provide one or more electrical connections between the first die 20 and the second die 40. Further, for example, one or more wire bonds may be formed between one or more conductive pads 46 of the second die 40 and one or more conductive pads 29 disposed on the first major surface 24 of the first die 20.

The second die 40 can include any suitable circuits or components disposed within the die or on one or both of the first major surface 42 and second major surface 44 of the die. In one or more embodiments, the second die 40 can include one or more conductors (not shown) disposed on the second major surface 44 that electrically connect one or more of the conductive pads 46. Further, in one or more embodiments, the second die 40 can include a nonconductive material 48 disposed on the second major surface 44 of the die. The nonconductive material 48 can include any suitable electrically insulating material or materials, e.g., standard underfills, die attach materials, pre-applied adhesive films, or any electrically insulating materials with an adhesive. The nonconductive material 48 can electrically isolate the conductive pads 46 that are disposed on the second major surface 44 of the die 40. Any suitable technique or techniques can be utilized to dispose the nonconductive material 48 on the second major surface 44 of the second die 40. Further, in one or more embodiments, a redistribution layer (not shown) can be disposed on the second major surface 44 of the second die 40. Any suitable redistribution layer can be utilized.

In one or more embodiments, the second die 40 can be electrically isolated from the first die 20 using any suitable technique or techniques. As illustrated in FIG. 1, a nonconductive material 60 is disposed in the cavity 30 between the first die 20 and the second die 40. For example, the nonconductive material 60 can be disposed in the cavity 30 between the first major surface 42 of the second die 40 and cavity 30 of the first die 20. Any suitable nonconductive material or materials can be utilized to electrically isolate the second die 40 from the first die 20, e.g., non-conductive polymers, epoxies, polyimides, adhesives, etc. The nonconductive material 60 can be disposed on any suitable portion or portions of one or more of the sidewalls 34 and bottom wall 36 of the cavity. In one or more embodiments, the nonconductive material 60 includes an adhesive such that the second die 40 can be retained within the cavity 30. Any suitable adhesive can be utilized.

Figure 3:
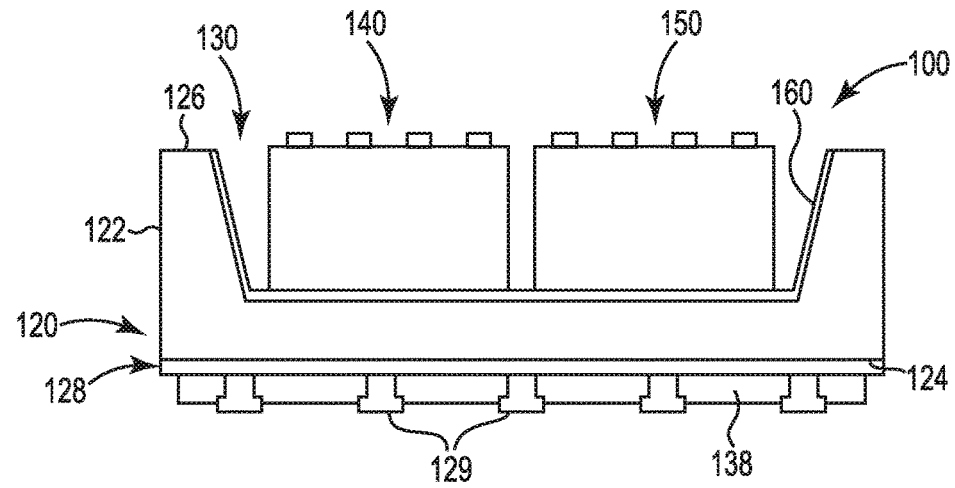
FIG. 3 is a schematic cross-section view of another embodiment of an integrated circuit module.

As mentioned herein, any suitable number of dies can be disposed within the cavity of the first die. For example, FIG. 3 is a schematic cross-section view of another embodiment of an integrated circuit module 100. All of the design considerations and possibilities regarding the integrated circuit module 10 of FIGS. 1-2 apply equally to the integrated circuit module 100 of FIG. 3. One difference between the integrated circuit module 100 of FIG. 3 and module 10 of FIGS. 1-2 is that module 100 includes a second die 140 and a third die 150 disposed at least partially within a cavity 130 disposed in a second major surface 126 of an active substrate 122 of a first die 120. Although two dies 140, 150 are depicted as being disposed at least partially within the cavity 130, any suitable number of dies can be disposed within such cavity. In one or more embodiments, one or both of the second and third dies 140, 150 can be disposed completely within the cavity 130. The second die 140 and the third die 150 can be electrically isolated from the first die 120 by a nonconductive material 160 disposed between the second and third dies and the cavity 130. The second and third dies 140, 150 can include any suitable dies, e.g., the same dies described herein regarding the second die 40 of the integrated circuit module 10 of FIGS. 1-2. In one or more embodiments, the second die 140 and the third die 150 include the same circuits or components. In one or more embodiments, the second die 140 includes a circuit or component that is different from the circuits or components of the third die 150. Any suitable technique or techniques can be utilized to dispose the second and third dies 140, 150 at least partially within the cavity 130 as is further described herein.

As illustrated in FIG. 3, the first die 120 includes an integrated circuit 128 disposed on a first major surface 124 of the first die. The integrated circuit 128 can include any suitable circuits or components, e.g., the same circuits or components described regarding the integrated circuit 28 of first die 20 of FIGS. 1-2.

As mentioned herein, the disclosed integrated circuit modules can be formed using any suitable technique or techniques. For example, FIGS. 4A-H are schematic views of one method 200 of forming the integrated circuit module 10. While the method 200 is described in reference to the module 10 of FIGS. 1-2, the method can be utilized to form any suitable integrated circuit module.

Figure 4A:
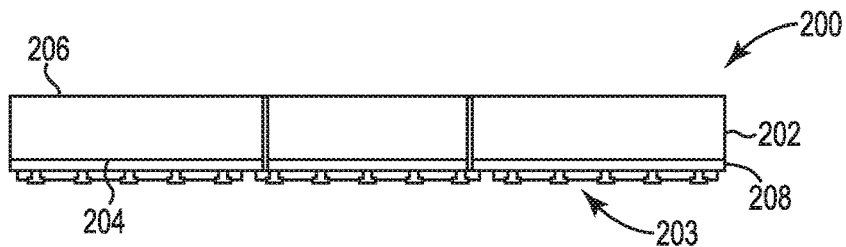
FIGS. 4A-H are schematic views of one embodiment of a method of forming an integrated circuit module.

In FIG. 4A, one or more integrated circuits 208 can be disposed on a first major surface 204 of an active substrate wafer 202. The wafer 202 can include any suitable material or combination of materials, e.g., the same materials described herein regarding the active substrate 22 of module 10. Any suitable technique or techniques can be utilized to form the one or more integrated circuits 208 on the first major surface 204 of the active substrate wafer 202. Each of the integrated circuits 208 can include the same or different circuits or components. In one or more embodiments, the active substrate wafer 202 can be partially singulated between integrated circuits 208 as shown in FIG. 4A using any suitable technique or techniques. In one or more embodiments, the active substrate 202 can be completely singulated to form one or more first dies 203. Although not shown, a second major surface 206 of the active substrate wafer 202 can be polished using any suitable technique or techniques.

Figure 4B:
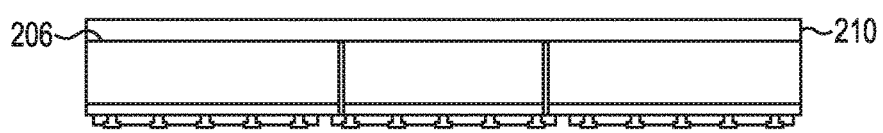
Figure 4C:
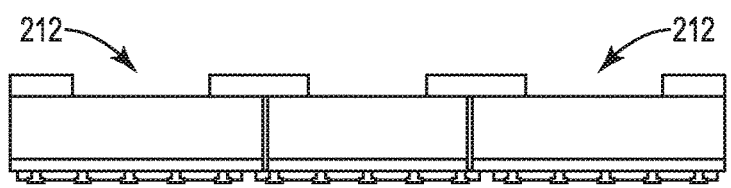

In FIG. 4B, a dielectric layer 210 (e.g., photoresist layer) can be disposed on the second major surface 206 of the active substrate wafer 202 using any suitable technique or techniques. The dielectric layer 210 can be patterned using any suitable technique or techniques to form one or more openings 212 in the nonconductive layer as shown in FIG. 4C. After patterning, the nonconductive layer 206 can be cured using any suitable technique or techniques.

Figure 4D:
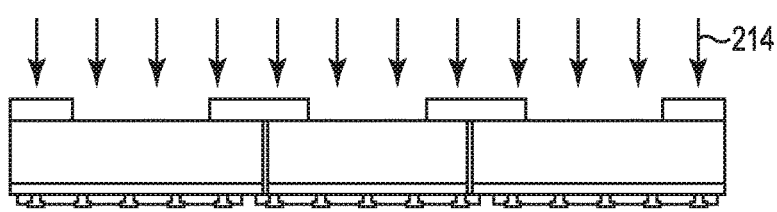
Figure 4E:
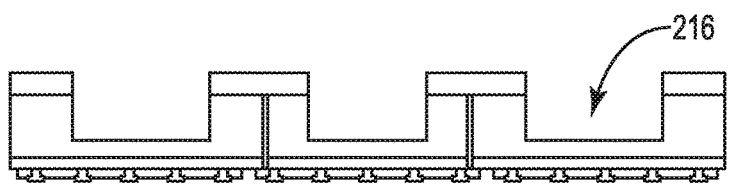

Following curing of the nonconductive layer 212, the active substrate wafer 202 can be etched using any suitable technique or techniques as shown in FIG. 4D. For example, etchant 214 can be directed at the dielectric layer 210 and the active substrate wafer 202. The etchant 214 can be any suitable etchant. In one or more embodiments, the active substrate wafer 202 can be etched using a wet etching technique that includes, e.g., KOH. In one or more embodiments, the active substrate wafer 202 can be etched using a DRIE or plasma etching process. The etching process 214 can dispose one or more cavities 216 in the second major surface 206 of the active substrate wafer 202 (or in the second major surface 26 of the first die 20 if the active substrate wafer has been singulated to provide discrete integrated circuit modules 10) as shown in FIG. 4E. Any suitable number of cavities 216 can be disposed in the second major surface 206. In one or more embodiments, each of the cavities 216 can be aligned with an integrated circuit 208 using any suitable technique or techniques. Any suitable cavity or cavities 216 can be disposed in the second major surface 206. In one or more embodiments, each of the cavities 216 has the same shape and dimensions. In one or more embodiments, one or more of the cavities 216 have one or both of a shape and dimensions that is different from one or both of a shape and dimensions of another cavity. One or more cavities 216 can be the same as the cavity 30 described in regard to the integrated circuit module 10 of FIGS. 1-2.

Figure 4F:
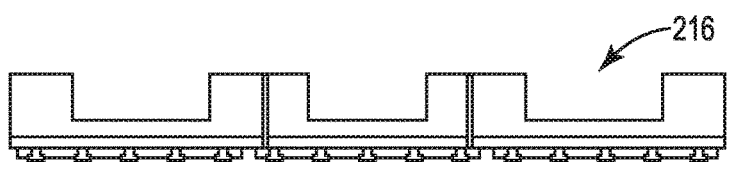

The dielectric layer 210 can be removed from the active substrate wafer 202 as is shown in FIG. 4F using any suitable technique or techniques.

Figure 4G:
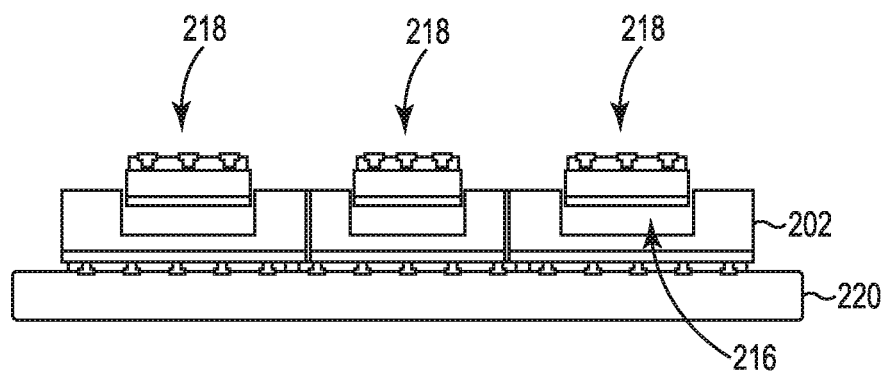

In FIG. 4G, one or more second dies 218 (e.g., second die 40 of FIGS. 1-2) can be disposed at least partially within one or more of the cavities 216 of the active substrate wafer 202. In one or more embodiments, the second dies 218 are identical. In one or more embodiments, at least one second die 218 is different from another second die. Further, in one or more embodiments, one or more of the second dies 218 can be disposed completely within one or more cavities 216. As is also shown in FIG. 4G, the active substrate wafer 202 can be disposed on a carrier 220 using any suitable technique or techniques. Any suitable carrier 220 can be utilized to support the active substrate wafer 202 during processing. In one or more embodiments, the active substrate wafer 202 can be temporarily connected to the carrier 220 using a temporary adhesive.

Figure 4H:
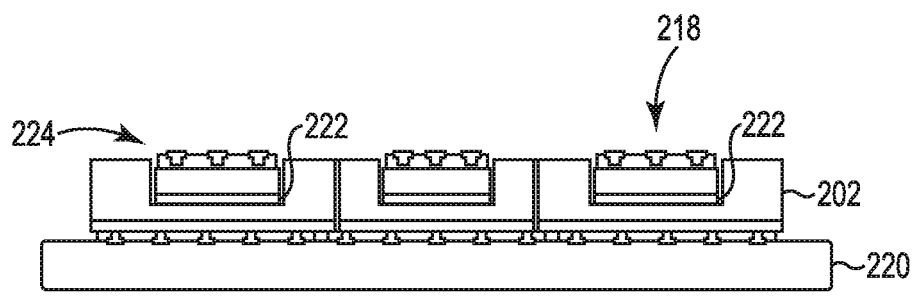

As shown in FIG. 4H, a nonconductive layer 222 can be disposed between one or more of the second dies 218 and the cavities 216. Any suitable nonconductive layer 222 can be utilized, e.g., the same nonconductive layer described regarding nonconductive layer 60 of FIGS. 1-2. In one or more embodiments, the nonconductive layer 222 can include an adhesive. Any suitable adhesive can be utilized. In one or more embodiments, the adhesive 222 is a photo-curable adhesive that can be cured such that the second dies 218 become attached to the cavities 216. After curing the nonconductive layer 222, the active substrate wafer 202 can be completely singulated to provide one or more integrated circuit modules 224 using any suitable technique or techniques, where modules include the first die 203 and the second die 218 disposed in the cavity 216 of the first die.

Figure 5:
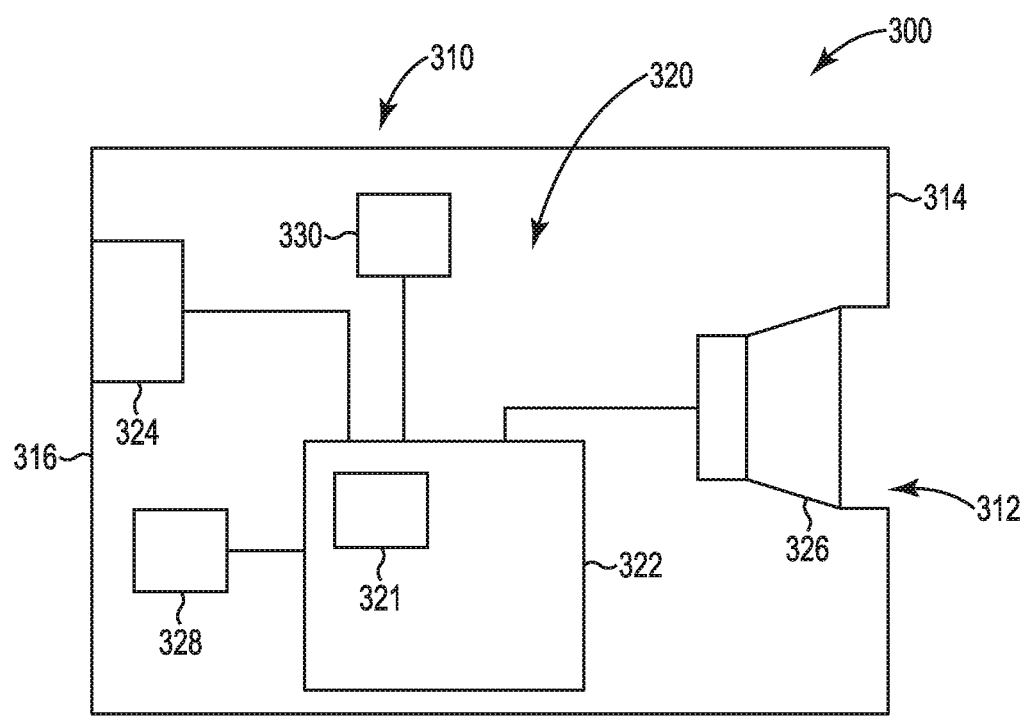
FIG. 5 is a schematic diagram of one embodiment of a hearing assistance device.

As mentioned herein, the various embodiments of integrated circuit modules can be utilized in any suitable device or system. For example, FIG. 5 is a schematic cross-section view of a hearing assistance device 300. The device 300 includes a housing 310 and hearing assistance components 320 enclosed in the housing. The hearing assistance components 320 can include any suitable circuits or devices, e.g., integrated circuits, microphones, power sources, microphones, speakers, etc. For example, in one or more embodiments, the components 320 can include an integrated circuit module 322, a microphone 324, a receiver (e.g., speaker) 326, a power source 328, and an antenna 330. The microphone 324, receiver 326, power source 328, and antenna 330 can be electrically connected to the integrated circuit module 322 using any suitable technique or techniques.

Any suitable integrated circuit module 322 or modules can be utilized with the device 300, e.g., integrated circuit module 10 of FIGS. 1-2. In one or more embodiments, the module 322 can include a processor 321. Any suitable processor 321 can be utilized with the hearing assistance device 300. For example, the processor 321 can be adapted to employ programmable gains to adjust the hearing assistance device output to a patient's particular hearing impairment. The processor 321 can be a digital signal processor (DSP), microprocessor, microcontroller, other digital logic, or combinations thereof. The processing can be done by a single processor, or can be distributed over different devices. The processing of signals referenced in this disclosure can be performed using the processor 321 or over different devices. Processing can be done in the digital domain, the analog domain, or combinations thereof. Processing can be done using subband processing techniques. Processing can be done using frequency domain or time domain approaches. Some processing can involve both frequency and time domain aspects. For brevity, in some examples drawings can omit certain blocks that perform frequency synthesis, frequency analysis, analog-to-digital conversion, digital-to-analog conversion, amplification, buffering, and certain types of filtering and processing. In one or more embodiments, the processor 321 is adapted to perform instructions stored in one or more memories, which can or cannot be explicitly shown. Various types of memory can be used, including volatile and nonvolatile forms of memory. In one or more embodiments, the processor or other processing devices execute instructions to perform a number of signal processing tasks. Such embodiments can include analog components in communication with the processor 321 to perform signal processing tasks, such as sound reception by a microphone, or playing of sound using a receiver (i.e., in applications where such transducers are used). In one or more embodiments, different realizations of the block diagrams, circuits, and processes set forth herein can be created by one of skill in the art without departing from the scope of the present disclosure.

The hearing assistance components 320 can also include the microphone 324 that is electrically connected to the module 322. Although one microphone 324 is depicted, the components 320 can include any suitable number of microphones. Further, the microphone 324 can be disposed in any suitable location within the housing 310. For example, in one or more embodiments, a port or opening can be formed in the housing 310, and the microphone 324 can be disposed adjacent the port to receive audio information from the patient's environment.

Any suitable microphone 324 can be utilized. In one or more embodiments, the microphone 324 can be selected to detect one or more audio signals and convert such signals to an electrical signal that is provided to the integrated circuit module 322. Although not shown, the module 322 can include an analog-to-digital convertor that converts the electrical signal from the microphone 324 to a digital signal.

Electrically connected to the module 322 is the receiver 326. Any suitable receiver or receivers can be utilized. In one or more embodiments, the receiver 326 can be adapted to convert an electrical signal from the module 322 to an acoustic output or sound that can be transmitted from the housing 310 to an earmold (not shown) and provided to a patient. In one or more embodiments, the receiver 326 can be disposed adjacent an opening 312 disposed in a first end 314 of the housing 310. As used herein, the term "adjacent the opening" means that the receiver 326 is disposed closer to the opening 312 in the first end 314 than to a second end 316 of the housing 310.

The power source 328 is electrically connected to the module 322 and is adapted to provide electrical energy to the module and one or more of the other hearing assistance components 320. The power source 328 can include any suitable power source or power sources, e.g., a battery. In one or more embodiments, the power source 328 can include a rechargeable battery. In one or more embodiments, the components 320 can include two or more power sources 328.

The components 320 can also include the optional antenna 330. Any suitable antenna or combination of antennas can be utilized. In one or more embodiments, the antenna 330 can include one or more antennas having any suitable configuration. For example, antenna configurations can vary and can be included within the housing 310 or be external to the housing. Further, the antenna 330 can be compatible with any suitable protocol or combination of protocols. In one or more embodiments, the antenna 330 can also include one or both of a transmitter that transmits electromagnetic signals and a receiver that receivers electromagnetic signals.

In general, the various embodiments of integrated circuit modules described herein can be electrically connected to one or more circuits or components using any suitable technique or techniques. For example, the integrated circuit module 10 of FIGS. 1-2 can be wire-bonded to one or more additional circuits or components. Further, the integrated circuit module 10 can be disposed on or within a flexible substrate.

Figure 6:
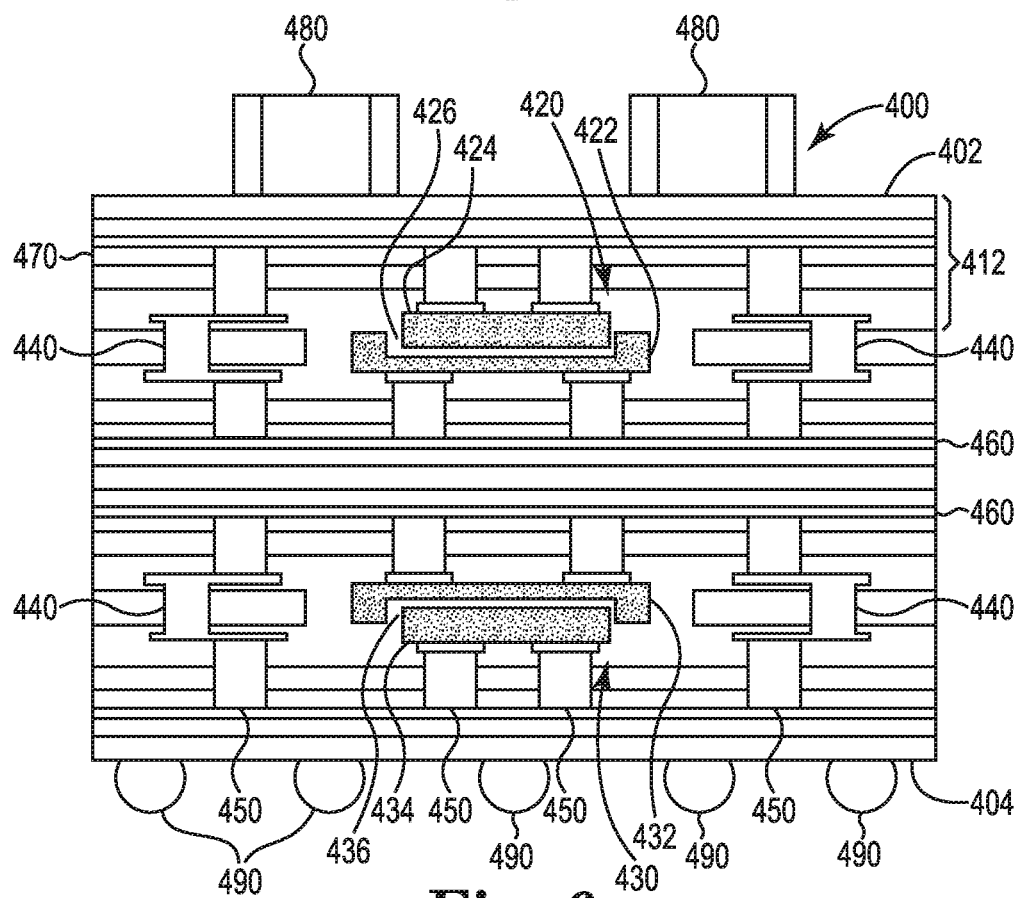
FIG. 6 is a schematic cross-section view of one embodiment of a flexible circuit substrate that includes one or more embedded integrated circuit modules.

Any suitable flexible substrate can be utilized. For example, FIG. 6 is a schematic cross-section of one embodiment of a flexible circuit substrate 400. The flexible substrate 400 can be utilized with any suitable device or system, e.g., the hearing assistance device 300 of FIG. 5. The flexible circuit substrate 400 can include one or more layers 412. The one or more layers 412 can include any suitable material or combination of materials. In one or more embodiments, one or more of the layers 412 can include one or more conductive layers such as interconnect layer 460. Further, in one or more embodiments, the one or more layers 412 can include one or more insulative layers 470.

The flexible circuit substrate 400 also includes a first integrated circuit module 420 and a second integrated circuit module 430 each disposed within the flexible circuit substrate. The first integrated circuit module 420 and the second integrated circuit module 430 can include any suitable integrated circuit module or modules, e.g., integrated circuit module 10 of FIGS. 1-2. The first integrated circuit module 420 includes a first die 422 and a second die 424 disposed at least partially within a cavity 426 disposed in the first die. Further, the second integrated circuit module 430 includes a first die 432 and a second die 434 disposed at least partially within a cavity 436 disposed in the first die. In one or more embodiments, the first integrated circuit module 420 is the same as the second integrated circuit module 430. In one or more embodiments, the first integrated circuit module 420 is different from the second integrated circuit module 430, e.g., the first integrated circuit module includes one or more circuits or components that are different from one or more circuits and components included in the second integrated circuit module. Although depicted as including two integrated circuit modules 420, 430, the flexible circuit substrate 400 can include any suitable number of integrated circuit modules, e.g., one, two, three, four, or more modules.

The flexible circuit substrate 400 can include any suitable active and passive components or devices. For example, as illustrated in FIG. 6, the substrate 400 includes one or more components 440 disposed within the substrate. The components 440 can include any suitable active components. Further, the components 440 can include any suitable passive components, e.g., inductors, capacitors, etc. One or more conductive vias 450 can be disposed within the substrate 400 that are adapted to electrically connect the first and second modules 420, 430 and the components 440 to each other or to one or more interconnect layers 460 disposed within the substrate.

The substrate 400 also includes surface mount components 480 disposed on a first major surface 402 of the substrate. The surface mount components 480 can include any suitable active or passive components or devices. The substrate 400 also includes solder pad connections 490 disposed on a second major surface 404 of the substrate. The solder pad connections 490 can be adapted to electrically connect one or more of the first integrated circuit module 420, the second integrated circuit module 430, and any additional circuits or components disposed on or within the substrate 400 with circuits or devices disposed separately from the substrate. Any suitable number of solder pad connections 490 can be disposed on the second major surface 404 of the substrate 400. Although not shown, one or more surface mount components can also be disposed on the second major surface 404 of the substrate 400. Further, one or more solder pad connections can also be disposed on the first major surface 402 of the substrate 400.

The various embodiments of flexible circuit substrates described herein can be utilized in any suitable electronic device or system. For example, one or more embodiments of flexible circuit substrates can be used for any type of hearing aid IC-based module, such as a hearing aid power management integrated circuit (PMIC) module, whereby a PMIC die can be built into a flexible circuit substrate. In addition, the flexible circuit substrates described herein can be used for personal amplification devices and accessories or any related application that requires miniaturization at low cost. The present disclosure provides for the manufacture of smaller, higher density microelectronic devices, e.g., smaller hearing aids. The present disclosure can also provide a lower cost package than the thick film and FCOF packaging solutions, and can reduce defects due to mechanical die management that occur in some FCOF hearing aids today during the hearing aid assembly process.

One or more embodiments of flexible circuit substrates described herein can provide for smaller hearing aids by inserting the hearing aid DSP die (and/or other dies or ICs) within a flexible circuit substrate and solder mount technology (SMT) mounting other devices onto the flexible circuit substrate. One or more embodiments can also reduce the cost of microelectronic packages and can offer mechanical robustness improvement over flip chip on flex (FCOF) technology. In one or more embodiments, a very thin (3.5 mils in an embodiment) hearing aid DSP die module can be disposed into a flexible circuit substrate as opposed to mounting the die onto an outer surface of a substrate. One or more embodiments can further aid in miniaturizing microelectronic packages compared to FCOF and thick film technology. One or more embodiments can also provide a flexible circuit substrate that is more mechanically robust than FCOF technology, as no integrated circuits are exposed.

Figure 7A:
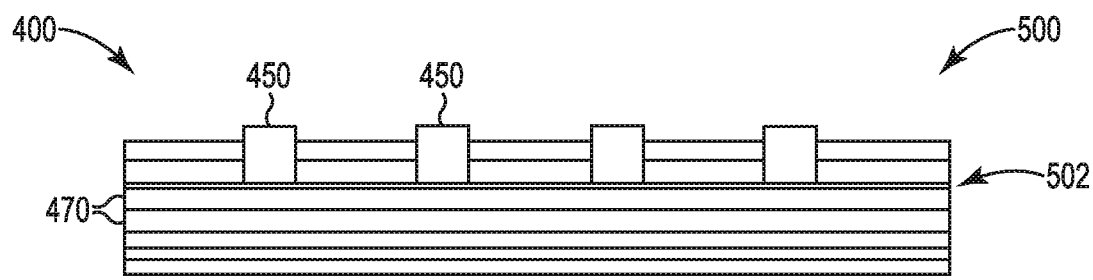
FIGS. 7A-G are schematic views of one embodiment of a method of forming a flexible circuit substrate that includes one or more embedded integrated circuit modules.

The flexible circuit substrates described herein can be formed using any suitable technique or combination of techniques. For example, FIGS. 7A-G illustrate one embodiment of a method 500 of forming a flexible circuit substrate. Although described regarding the flexible circuit substrate 400 of FIG. 6, the method 500 can be utilized to form any suitable flexible circuit substrate. In FIG. 7A, a first portion 502 of the flexible circuit substrate 400 can be formed using any suitable technique or combination of techniques. For example, one or more insulative layers 470 can be formed and attached using any suitable technique. Further, one or more conductive vias 450 can be formed using any suitable technique or techniques, e.g., deposition of a layer followed by etching of the layer to form the conductive vias.

Figure 7B:
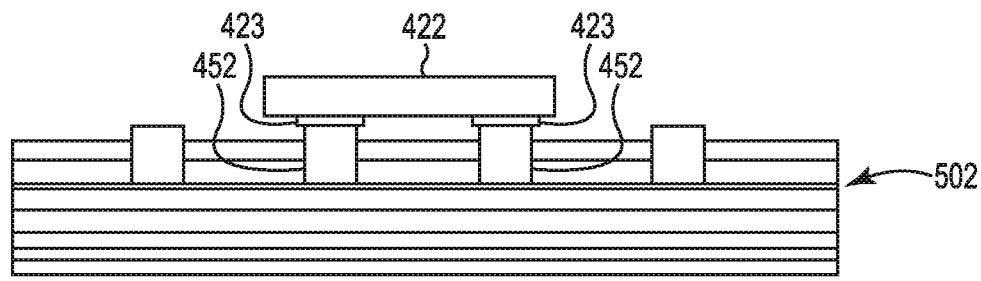

In FIG. 7B, the first die 422 of the first integrated circuit module 420 can be disposed on one or more conductive vias 452 of the conductive vias 450 such that one or more conductive pads 423 of the first die are electrically connected to the one or more conductive vias. Any suitable technique or techniques can be utilized to electrically connect the conductive pads 423 of the first die 422 to the conductive vias 452 of the first flexible substrate portion 602.

Figure 7C:
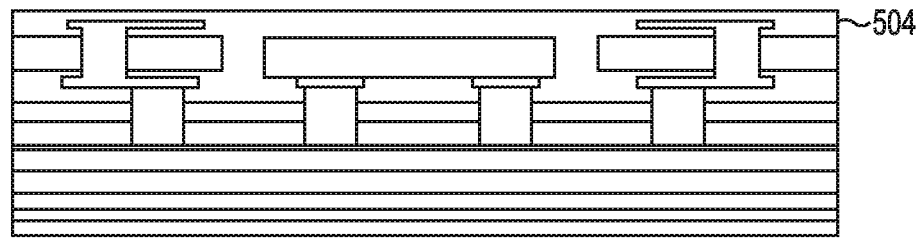
Figure 7D:
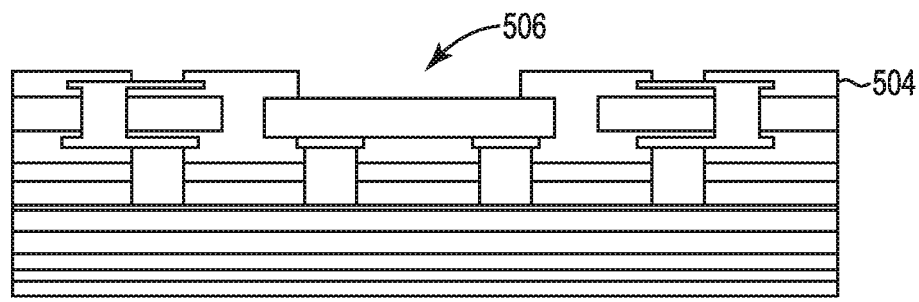
Figure 7E:
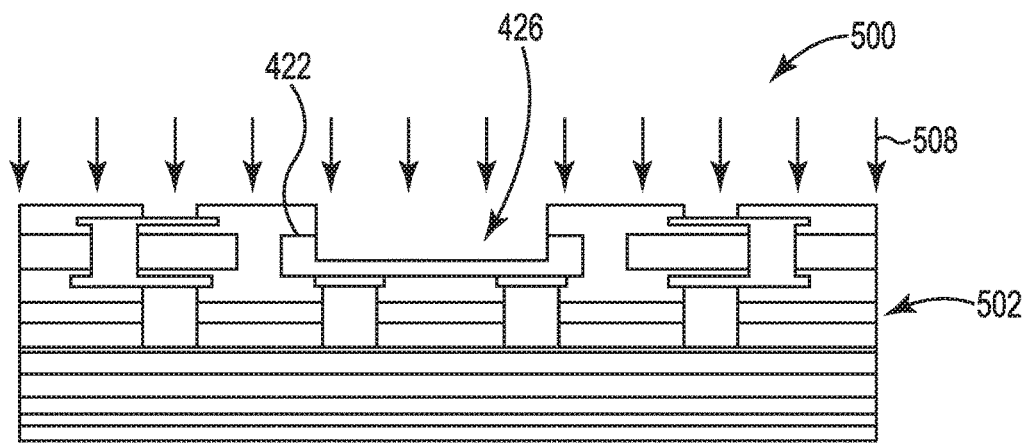

A dielectric layer 504 can be disposed over the first flexible circuit substrate portion 502 and the first die 422 using any suitable technique or techniques as is shown in FIG. 7C. Any suitable dielectric layer 504 can be utilized, e.g., a photoresist layer. In FIG. 7D, the dielectric layer 504 can be patterned using any suitable technique or techniques to provide one or more openings 506 in the dielectric layer. For example, the dielectric layer 504 can be laser ablated to provide the one or more openings 506. After patterning the nonconductive layer 506, the first die 422 of the first integrated circuit module 420 can be etched using any suitable etching technique, e.g., the same etching techniques described herein regarding the integrated circuit module 10 of FIG. 1. For example, an etchant or plasma 508 can be directed onto the first die 422. The first die 422 can be etched to dispose a cavity 426 in the first die.

Figure 7F:
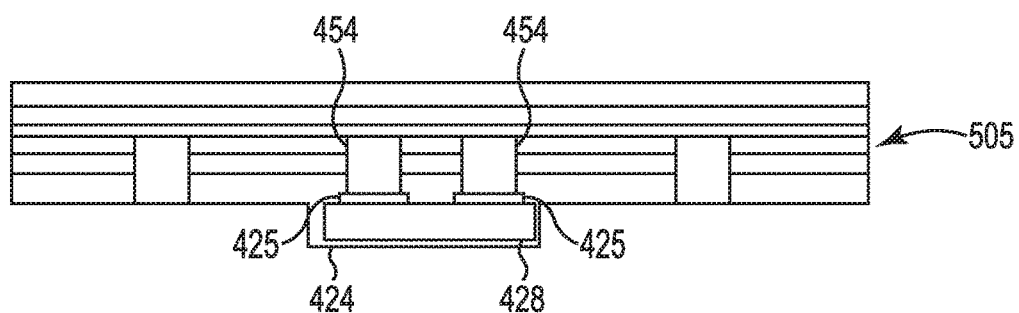

As shown in FIG. 7F, the second die 424 can be disposed on a second flexible circuit substrate portion 505 such that a conductive pad 425 or pads of the second die are electrically connected to one or more conductive vias 454 of the conductive vias 450 of the second flexible circuit substrate portion using any suitable technique or techniques, e.g., a conductive adhesive can be disposed between the conductive pads and the conductive vias to provide an electrical connection.

Figure 7G:
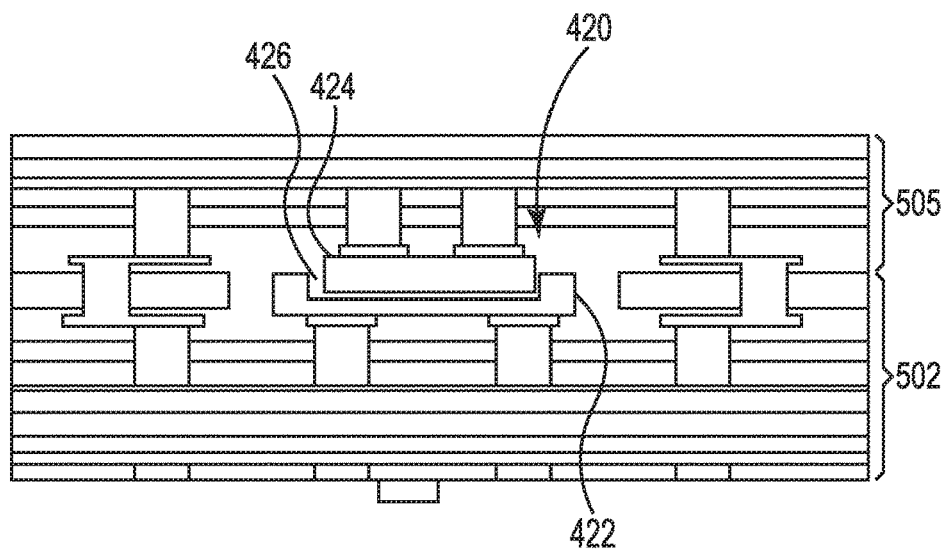

In FIG. 7G, the first flexible substrate portion 502 can be connected to the second flexible circuit substrate portion 505 such that the second die 424 is disposed at least partially within the cavity 426 of the first die 422. Any suitable technique or techniques can be utilized to connect to the first flexible circuit substrate portion 502 to the second flexible circuit substrate portion 505. For example, in one or more embodiments, an adhesive can be disposed on one or both of the first flexible circuit substrate portion 502 and the second flexible circuit substrate portion 505, and the two portions can be brought together and attached. Further, a nonconductive layer 428 can be disposed on one or both of the second die 424 and the cavity 426 such that the second die is electrically isolated from the first die.

Although not shown, the second integrated circuit module 430 of the flexible circuit substrate 400 can be formed using the same techniques described herein to provide the first integrated circuit module 420. In one or more embodiments, the second integrated circuit module 430 can be disposed in the flexible circuit substrate 400 using techniques that are different from the techniques utilized to form the first integrated circuit module 420. The first and second flexible substrate portions 502, 505 utilized to form the first integrated circuit module 420 can be connected to one or more flexible substrate portions utilized to form the second integrated circuit module 430 using any suitable technique or techniques to provide the flexible circuit substrate 400.

All references and publications cited herein are expressly incorporated herein by reference in their entirety into this disclosure, except to the extent they may directly contradict this disclosure. Illustrative embodiments of this disclosure are discussed and reference has been made to possible variations within the scope of this disclosure. These and other variations and modifications in the disclosure will be apparent to those skilled in the art without departing from the scope of the disclosure, and it should be understood that this disclosure is not limited to the illustrative embodiments set forth herein. Accordingly, the disclosure is to be limited only by the claims provided below.

What is claimed is:

1. An integrated circuit module, comprising:
a first die comprising an active substrate, an integrated circuit disposed on a first major surface of the active substrate, and a cavity disposed in a second major surface of the active substrate; and
a second die comprising a first major surface, a second major surface, and a conductive pad disposed on the second major surface of the second die, wherein the second die is disposed at least partially within the cavity of the first die such that the first major surface of the second die faces the cavity of the first die.

2. The module of claim 1, wherein the second die is disposed completely within the cavity.

3. The module of claim 1, wherein the first die is fabricated via a first type of fabrication process, and further wherein the second die is fabricated via a second type of fabrication process different from the first type of fabrication process.

4. The module of claim 1, wherein the first die comprises a digital signal processor die.

5. The module of claim 1, wherein the second die comprises an integrated passive device die.

6. The module of claim 1, wherein the second die comprises a memory die.

7. The module of claim 1, further comprising a nonconductive material disposed between the first major surface of the second die and the cavity.

8. The module of claim 7, wherein the nonconductive material comprises an adhesive.

9. The module of claim 1, further comprising a nonconductive material disposed on the second major surface of the second die.

10. The module of claim 1, further comprising a nonconductive material disposed on at least a portion of the integrated circuit and the first major surface of the active substrate of the first die.

11. The module of claim 1, wherein the first die further comprises a redistribution layer disposed on the integrated circuit.

12. The module of claim 1, further comprising a third die disposed at least partially within the cavity.

13. A hearing assistance device, comprising:
a flexible circuit substrate; and
an integrated circuit module disposed within the flexible circuit substrate, wherein the integrated circuit module comprises:
a first die comprising an active substrate, an integrated circuit disposed on a first major surface of the active substrate, and a cavity disposed in a second major surface of the active substrate; and
a second die comprising a first major surface, a second major surface, and a conductive pad disposed on the second major surface of the second die, wherein the second die is disposed at least partially within the cavity of the first die such that the first major surface of the second die faces the cavity of the first die.

14. The hearing assistance device of claim 13 wherein the flexible circuit substrate comprises a surface mount component disposed on a first major surface of the flexible circuit substrate and a solder pad connection disposed on a second major surface of the flexible circuit substrate.

15. The hearing assistance device of claim 13, wherein the flexible circuit substrate comprises a plurality of layers.

* * * * *